United States Patent [19]

Shigesada

[11] Patent Number: 4,966,832
[45] Date of Patent: Oct. 30, 1990

[54] METHOD OF TREATING INNER MOLD SURFACE

[75] Inventor: Masaaki Shigesada, Hatano, Japan

[73] Assignee: Nissan Motor Co., Ltd., Yokohama, Japan

[21] Appl. No.: 350,195

[22] Filed: May 11, 1989

[30] Foreign Application Priority Data

May 13, 1988 [JP] Japan ................... 63-116419

[51] Int. Cl.⁵ .............................................. G03C 5/00
[52] U.S. Cl. .................... 430/323; 430/299; 430/324; 430/329; 430/430
[58] Field of Search ............... 430/299, 323, 324, 329, 430/430

[56] References Cited

U.S. PATENT DOCUMENTS 4,902,607 2/1990 Lee .................................. 420/323
4,908,299 3/1990 Ogawa ........................... 430/323

Primary Examiner—Marion C. McCamish
Assistant Examiner—Anang Sridharan
Attorney, Agent, or Firm—Foley & Lardner, Schwartz, Jeffery, Schwaab, Mack, Blumenthal & Evans

[57] ABSTRACT

To mold artificial leather provided with real leather like feeling or touch on the surface thereof, a leather wrinkle pattern is formed on the artificial leather in such a way that the ridge portions are glazed and the furrow portions are matted. For the purpose of molding the above-mentioned artificial leather, the inner surface of the metallic mold is contrary formed in such a way that the ridge portions are matted but the furrow portions are glazed.

9 Claims, 2 Drawing Sheets

METHOD OF TREATING INNER MOLD SURFACE

BACKGROUND OF THE INVENTION

1. Field of the Invention

The present invention relates to a method of treating the inner surface of a metallic mold for molding resin products and more specifically to a method of treating the inner surface of a metallic mold suitable for use in molding artificial leather formed with a leather like pattern.

2. Description of the Prior Art

To manufacture artificial (resin) leather, it is necessary to form a leather like pattern on the surface of the resin leather. Therefore, a predetermined pattern is formed on the inner surface of a metallic mold for manufacturing resin leather. In the prior-art method of treating a metallic mold, a leather like pattern is usually formed on the inner surface of a metallic mold simply in accordance with only etching treatment as disclosed in "METALLIC SURFACE TECHNICAL MANUAL" (2nd Edition) edited by Japanese Metallic Surface Technical Association and published by NIKKAN KOGYO SHINBUN Co., Ltd. on Dec. 25, 1977, for instance. After etching treatment in the prior-art method, the metallic mold is finished by performing various treatments such as cleaning, anticorrosion treatment, antidiscoloration treatment, heat treatment, etc.

In the prior-art method of forming a leather like pattern on the inner surface of a metallic mold in accordance with only etching treatment, there exists a problem in that since the surface condition are uniform all over the inner surface of a metallic mold, it is impossible to provide real leather like feeling or touch for the surface of the molded artificial resin leather.

SUMMARY OF THE INVENTION

With these problems in mind, therefore, it is the primary object of the present invention to provide a method of treating an inner surface of a metallic mold so that real leather like feeling or touch can be obtained; that is, artificial leather is formed with a pattern whose ridge portions are glazed but furrow portions are matted.

To achieve the above-mentioned object, a method of treating an inner surface of a mold, according to the present invention comprises the steps of: (a) forming a pattern including ridge portions and furrow portions on an inner surface of a mold by etching; (b) matting the entire inner surface of the mold; (c) coating a resin layer on the matted surface; (d) forming a photosensitive film on the coated resin layer; (e) exposing only the photosensitive film formed on the ridge portions of the pattern to light by use of a pattern film formed with the same pattern as that formed on the inner surface of the mold; (f) removing the photosensitive film and the resin layer from the non-exposed furrow portions by a solvent to mask only the ridge portions by the photosensitive film and the resin layer; (g) glazing only the non-masked furrow portions; and (h) removing the photosensitive film and the resin layer from the ridge portions to obtain a mold formed with a pattern such that the ridge portions are matted but the furrow portions are glazed.

In the method of treating an inner surface of a mold according to the present invention, since the ridge portions are matted and the furrow portions are glazed on the inner surface of the mold, when artificial leather is molded by use of a mold thus treated, it is possible to mold artificial leather formed with a wrinkle pattern in which ridge portions are glazed and the furrow portions are matted; that is, it is possible to provide a real leather like wrinkle pattern on the surface of artificial leather.

DETAILED DESCRIPTION OF THE INVENTION

Figure 1:
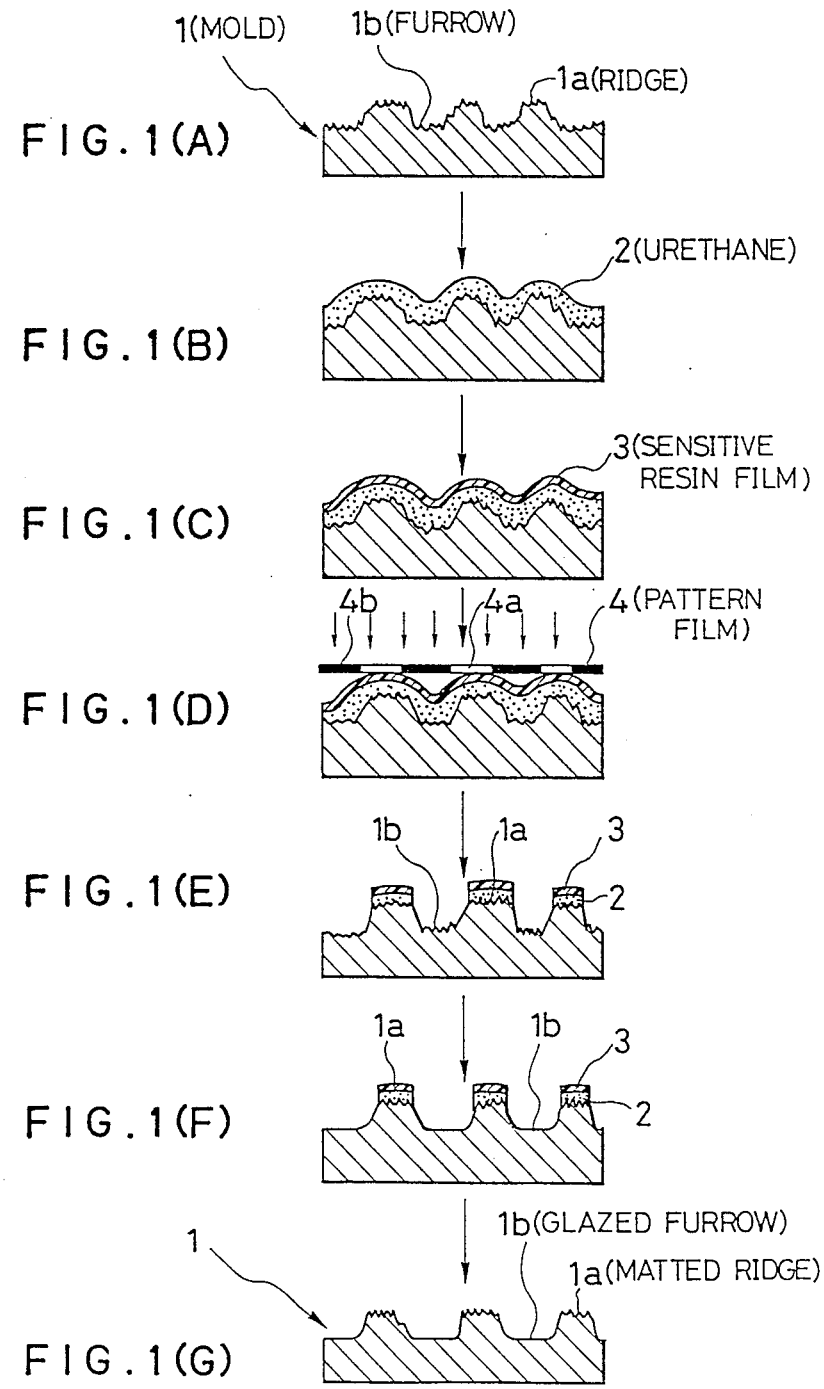
FIG. 1 is a sequential cross-sectional view for assistance in explaining the method according to the present invention.

The method of the present invention will be described hereinbelow with reference to FIGS. 1 and 2. First, a metallic mold 1 on the inner surface of which a predetermined leather wrinkle pattern is formed in accordance with the prior-art etching method is prepared. The inner surface of this mold is matted by honing or sand blast, as shown by (A) in FIG. 1 (in step S1 of FIG. 2). In FIG. 1, the reference numeral 1a denotes small ridge portions of leather like wrinkles formed on the inner surface of the mold 1, for contrary forming furrow portions on the surface of molded artificial leather; and the reference numeral 1b denotes small furrow portions of leather like wrinkles formed on the inner surface of the mold 1, for contrary forming ridge portions on the surface of molded artificial leather.

Figure 2:
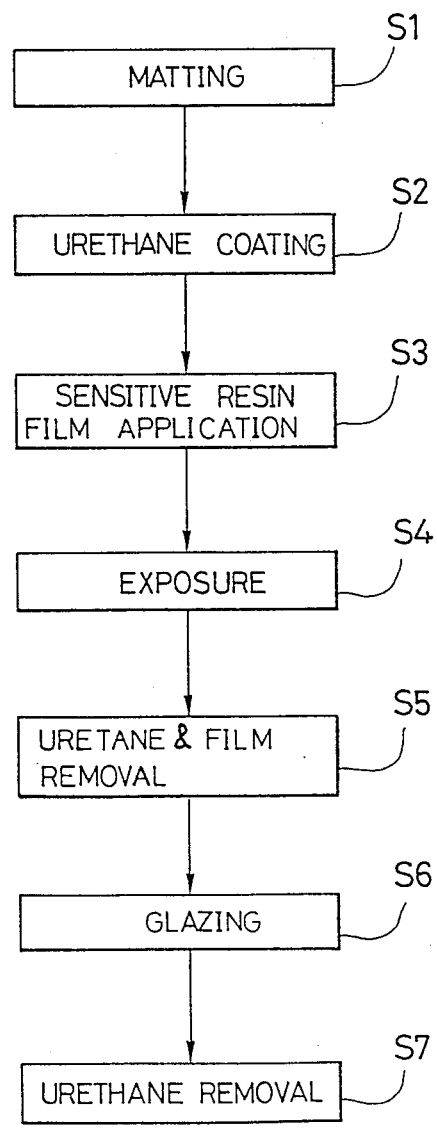
FIG. 2 is a process chart of the method according to the present invention.

After matting treatment, urethane is uniformly coated on the matted surface of the mold to form an urethane layer 2, as shown by (B) in FIG. 1 (in step S2 of FIG. 2). An acid-proof photosensitive resin is applied to the urethane coated surface of the mold to form a photosensitive resin film 3, as shown by (c) in FIG. 1 (in step S3 of FIG. 2). Thereafter, another pattern resin film 4 is placed on the applied resin film 3 in order to expose only the ridge portions 1a to light, as shown by (D) in FIG. 1 (in step S4 of FIG. 2). In this exposure process S4, the pattern resin film 4 is formed with transparent portions corresponding to the ridge portions 1a and black opaque portions corresponding to the furrow portions 16 in such a way as to provide the same leather like wrinkle pattern as that formed on the inner surface of the mold 1. This pattern resin film 4 is placed on the inner surface of the mold by placing the transparent portions 4a of the film 4 on the ridge portions 1a of the mold 1 and the opaque portions 4b of the film 4 on the furrow portion 16 of the mold 1.

Thereafter, the pattern resin film 4 is removed and the mold 1 is developed by an organic solvent in order to remove the photosensitive resin film 3 and the urethane coated layer 2 (not exposed to light) together from the furrow portions 16, as shown by (E) in FIG. 1 (in step S5 of FIG. 2). In this development step, only the ridge portions 1a are masked by the photosensitive resin film 3 and the urethane layer 2 (both exposed to light). Under the conditions that the ridge portions 1a are masked, the inner surface of the mold 1 is glazed by blowing glass beads against the inner mold surface or by treating the inner mold surface with an acid in order to glaze (polish) only the furrow portions 16, as shown by (F) in FIG. 1 (in step S6 of FIG. 2). Lastly, the exposed photosensitive resin film 3 and the coated urethane layer 2 are both removed from the ridge portions 1a of the inner mold surface, as shown by (G) in FIG. 1 (in step S7 of FIG. 2). In accordance with the above-mentioned process, it is possible to obtain a metallic mold on the inner surface of which the ridge portions 1a are matted but the furrow portions 1b are glazed.

Thereafter, the metallic mold 1 is finished in accordance with the various conventional process such as cleaning, anticorrosion treatment, antidiscoloration treatment, heat treatment, etc.

When artificial (resin) leather is molded by use of the metallic mold 1 whose inner surface is treated in accordance with the method according to the present invention, since the ridge portions on the molded product (corresponding to the furrow portions 1b of the metallic mold 1) are glazed or polished and the furrow portion on the molded product (corresponding to the ridge portions 1a of the metallic mold 1) are matted or not polished, the furrow portions on the artificial leather can be seen more deeply and clearly or sharply, as compared with artificial leather whose ridge and furrow portions are finished in the same way as is conventional, thus providing artificial leather whose surface pattern can provide real leather like feeling and touch and therefore improving the quality of artificial leather.

What is claimed is:

1. A method of treating an inner surface of a mold, comprising the steps of:
    (a) forming a pattern including ridge portions and furrow portions on an inner surface of a mold by etching;
    (b) matting the entire inner surface of the mold;
    (c) coating a resin layer on the matted surface;
    (d) forming a photosensitive film on the coated resin layer;
    (e) exposing only the photosensitive film formed on the ridge portions of the pattern to light by use of a pattern film formed with the same pattern as that formed on the inner surface of the mold;
    (f) removing the photosensitive film and the resin layer from the non-exposed furrow portions by a solvent to mask only the ridge portions by the photosensitive film and the resin layer;
    (g) glazing only the non-masked furrow portions; and
    (h) removing the photosensitive film and the resin layer from the ridge portions to obtain a mold formed with a pattern such that the ridge portions are matted but the furrow portions are glazed.

2. The method of claim 1, wherein the pattern is a wrinkle pattern formed on an artificial leather.

3. The method of claim 1, wherein the entire inner surface of the mold is matted by honing in step (b).

4. The method of claim 1, wherein the entire inner surface of the mold is matted by sand blast in step (b).

5. The method of claim 1, wherein the resin layer coated on the matted surface is an urethane layer in step (c).

6. The method of claim 1, wherein the photosensitive film formed on the resin coated layer is an acid-proof resin film in step (d).

7. The method of claim 1, wherein the solvent used to remove the photosensitive film and the resin layer is an organic solvent in step (f).

8. The method of claim 1, wherein the non-masked furrow portions are glazed by blowing glass beads in step (g).

9. The method of claim 1, wherein the non-masked furrow portions are glazed with an acid in step (g).

* * * * *